United States Patent
Kim

(10) Patent No.: US 9,121,925 B2
(45) Date of Patent: Sep. 1, 2015

(54) ULTRAWIDEBAND RADAR

(75) Inventor: Tae Wook Kim, Seoul (KR)

(73) Assignee: Industry-Academic Cooperation Foundation, Yonsei University, Seoul (KR)

(*) Notice: Subject to any disclaimer, the term of this patent is extended or adjusted under 35 U.S.C. 154(b) by 359 days.

(21) Appl. No.: 13/584,012

(22) Filed: Aug. 13, 2012

(65) Prior Publication Data

US 2013/0050011 A1 Feb. 28, 2013

(30) Foreign Application Priority Data

Aug. 22, 2011 (KR) .................. 10-2011-0083352

(51) Int. Cl.
| | |
|---|---|
| G01S 13/00 | (2006.01) |
| G01S 7/285 | (2006.01) |
| G01S 7/41 | (2006.01) |
| G01S 13/04 | (2006.01) |
| H03M 1/12 | (2006.01) |
| G01S 13/02 | (2006.01) |
| G01S 13/88 | (2006.01) |

(52) U.S. Cl.
CPC ............... G01S 7/285 (2013.01); G01S 7/412 (2013.01); G01S 13/04 (2013.01); H03M 1/1245 (2013.01); G01S 13/0209 (2013.01); G01S 13/886 (2013.01)

(58) Field of Classification Search
CPC ... G01S 13/0209; G01S 13/04; G01S 13/886; G01S 7/285; H03M 1/1245
USPC .................................................. 342/27, 195
See application file for complete search history.

(56) References Cited

U.S. PATENT DOCUMENTS

| | | | |
|---|---|---|---|
| 7,769,072 B2* | 8/2010 | Abou Rjeily et al. ......... 375/130 |
| 7,773,031 B2 | 8/2010 | Gazelle et al. | |
| 2006/0140249 A1* | 6/2006 | Kohno .......................... 375/130 |
| 2008/0100496 A1* | 5/2008 | Richards et al. ................. 342/21 |
| 2008/0212653 A1* | 9/2008 | Kurashima et al. ............ 375/143 |
| 2008/0238717 A1* | 10/2008 | Short et al. ............... 340/870.21 |

FOREIGN PATENT DOCUMENTS

| | | |
|---|---|---|
| JP | 11-160424 A | 6/1999 |
| JP | 11-190779 | 7/1999 |

(Continued)

OTHER PUBLICATIONS

Verhelst et al., "A Reconfigurable, 0.13um CMOS, 110pJ/Pulse, Fully Integrated IR-UWB Receiver for Communication and Sub-cm Ranging," IEEE, Isscc 2009, 3 pp.
Helleputte et al., "A Reconfigurable, 130 nm CMOS 108 pJ/pulse, Fully Integrated IR-UWB Receiver for Communication and Precise Ranging," IEEE, JSSC vol. 45, No. 1, Jan. 2010, pp. 69-83.

(Continued)

*Primary Examiner* — Timothy A Brainard
(74) *Attorney, Agent, or Firm* — Carter, DeLuca, Farrell & Schmidt, LLP

(57) ABSTRACT

Radar in accordance with some embodiments of the inventive concept may include a transmission part outputting a signal to a target object; a receiving part receiving a reflected signal corresponding to the output signal of the transmission part; and a signal processing part receiving the reflected signal from the receiving part to distinguish the target object. The signal processing part directly samples the reflected signal and compares any one of the directly sampled reflected signal and a signal that the directly sampled reflected signal is restored with restored reflected signal data to distinguish the target object.

15 Claims, 13 Drawing Sheets

(56) References Cited

FOREIGN PATENT DOCUMENTS

| KR | 10-148668 A | 6/1998 |
| KR | 1020080102448 A | 11/2008 |
| KR | 1020100051412 A | 5/2010 |
| KR | 1020110058256 A | 6/2011 |

OTHER PUBLICATIONS

Zhang et al., "Real-Time Noncoherent UWB Positioning Radar With Millimeter Range Accuracy: Theory and Experiment," TMTT vol. 58, No. 1, Jan. 2010, pp. 9-20.

Chu et al., "A Short-Range UWB Impulse-Radio CMOS Sensor for Human Feature Detection," IEEE, ISSCC 2011, 3 pp.

* cited by examiner

ULTRAWIDEBAND RADAR

CROSS-REFERENCE TO RELATED APPLICATIONS

This U.S. non-provisional patent application claims priority under 35 U.S.C. §119 of Korean Patent Application No. 10-2011-0083352, filed on Aug. 22, 2011, the entire contents of which are hereby incorporated by reference.

BACKGROUND

The present inventive concept herein relates to radars, and more particularly, to ultra wideband radar.

A radar (radio detection and ranging) is a wireless device emitting a radio wave and checking the presence or absence of object, a distance between the radar and an object and a state of object. Using radar, a lot of information that cannot be checked by human eyes or human sense can be sensed at a long distance. To realize the function of radar, a usage of wideband frequency which are capable of containing a lot of information and a transmission and reception signals of repetition pulse are needed. Accordingly, a radar technology using an impulse of ultra wideband frequency characteristic has been gaining attention and an application range of radar technology is variously being expanded.

In radar using an impulse signal of ultra wideband, to process a reflected signal, a method of obtaining a correlation between a reflected signal and a signal of local oscillator, and then converting the result of correlation using an analog to digital converter (ADC) has been used or a method of local oscillator and sub-sampling has been used. However, these conventional methods may not provide a high degree of accuracy in restoration of reflected signals, and thus may not accurately detect an object.

SUMMARY

Embodiments of the inventive concept provide a radar. The radar may include a receiving part receiving a signal reflected from a target object and a signal processing part processing the reflected signal. The signal processing part directly samples the reflected signal.

Embodiments of the inventive concept also provide a signal processor. The signal processor may include a sampling part directly sampling an IR-UWB impulse signal and an interval control part changing the interval between sampled values.

Embodiments of the inventive concept also provide a method of processing an IR-UWB impulse signal. The method may include directly sampling the IR-UWB impulse signal with a first interval; changing the interval of sampled values to a second interval different from the first interval; and quantizing the sampled values with the second interval.

Embodiments of the inventive concept also provide a method of processing a signal. The method may include receiving an impulse signal train; sampling the impulse signal with at least Nyquist rate; expanding the interval between sampled values during non-signal period between two adjacent impulse signals in the impulse signal train.

BRIEF DESCRIPTION OF THE FIGURES

Embodiments of the inventive concept will be described below in more detail with reference to the accompanying drawings. The embodiments of the inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art. Like numbers refer to like elements throughout.

DETAILED DESCRIPTION OF THE EMBODIMENTS

Figure 1:
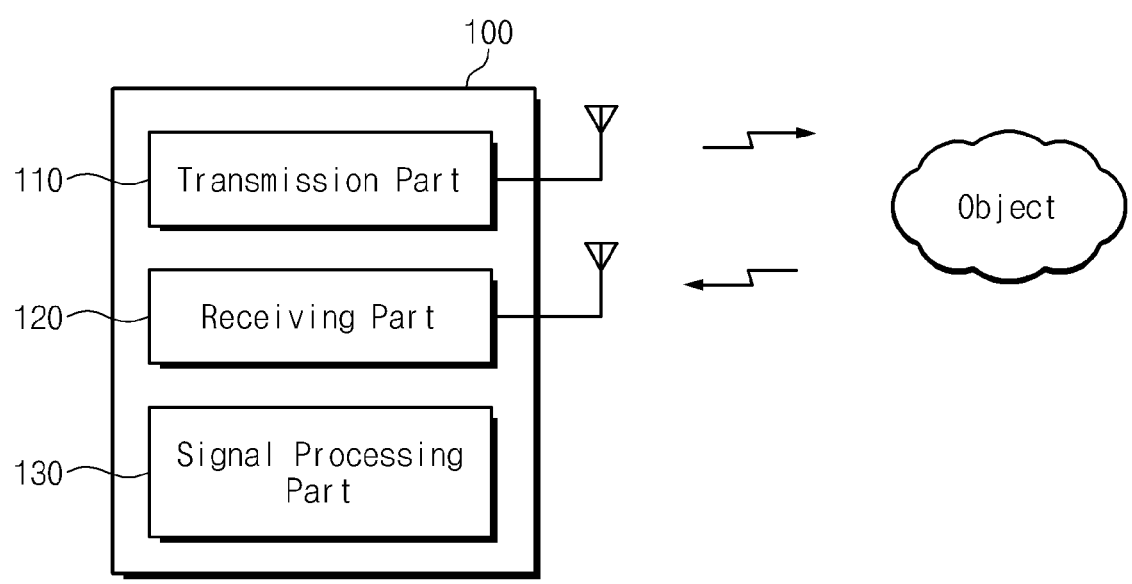
FIG. 1 is a block diagram illustrating a radar structure in accordance with some embodiments of the inventive concept.

Embodiments of inventive concepts will be described more fully hereinafter with reference to the accompanying drawings, in which embodiments of the invention are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art.

It will be understood that when an element is referred to as being "connected" or "coupled" to another element, it can be directly connected or coupled to the other element or intervening elements may be present. It will be understood that, although the terms first, second, etc. may be used herein to describe various elements, these elements should not be limited by these terms. These terms are only used to distinguish one element from another. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Some embodiments of the inventive concept relate to signal, for example IR-UWB signal processing method and apparatus.

Some embodiments of the inventive concept relate to radars and methods of recognizing an object using the radar, and more particularly, to an ultra wideband radar and a method of recognizing an object using the ultra wideband radar.

Signal processing in accordance with some embodiments of the inventive concept includes direct sampling an input signal with a first time interval, changing the first interval between the sampled signals into a second interval and quantizing the sampled signal with the second interval. The input signal herein may be IR-UWB but is not limited hereto. The input signal herein may be any signal having an amplitude and a period.

Radar in accordance with some embodiments of the inventive concept can receive an IR-UWB impulse signal reflected from a target object to directly sample it and can distinguish the target object by comparing a restored signal from the directly sampled signal with a reference signal data obtained from reflected signal from various objects.

The direct sampling may mean a signal processing that the signal being input is taken at predetermined intervals without taking an additional conversion process on the signal being input before sampling the signal being input. The direct sampling may mean that a sampling is performed without a process of up conversion or down conversion of frequency of signal being input before sampling. The direct sampling may mean that a sampling is performed without a correlation between a signal being input and other signal before sampling. Direct sampling may mean sampling a signal with at least Nyquist rate, not sampling the non-signal period (i.e., the period between signals).

Radar and a method of recognizing an object using the radar in accordance with some embodiments of the inventive concept can more accurately distinguish a target object by receiving an IR-UWB impulse signal reflected from a target object and directly sampling the reflected IR-UWB impulse signal.

FIG. 1 is a block diagram illustrating a radar in accordance with some embodiments of the inventive concept.

Referring to FIG. 1, the radar 100 includes a transmission part 110, a receiving part 120 and a signal processing part 130.

The transmission part 110 can output, for example, an IR-UWB impulse signal to a target object. The transmission part 110 may include a transmission antenna for outputting an IR-UWB impulse signal to a target object. The IR-UWB impulse signal may be an impulse signal having a pulse width of 1 ns. The receiving part 120 may include a receiving antenna for receiving a reflected signal from a target object.

An antenna having a narrow beam width can be used as the transmission antenna and/or the receiving antenna. For example, an antenna having a beam width of pencil beam (2~3°) or needle beam (0.1~1°) can be used as the transmission antenna and/or the receiving antenna. Also, the transmission antenna and/or the receiving antenna can use various types of antennas that can be used in an ultra wideband communication system. For example, the transmission antenna and/or the receiving antenna can use a chip antenna, a monopole antenna, a fat dipole antenna, a bow-tie antenna or combinations thereof.

Although not illustrated in the drawing, the transmission part 110 may further include an impulse signal generating means. The impulse signal generating means can be implemented by using a frequency synthesizer, a bipolar transistor or a schottky diode.

Although not illustrated in the drawing, the receiving part 120 may further include a low noise amplifier for amplifying a reflected signal being received. The low noise amplifier is designed so as to amplify a reflected signal being received and to minimize a noise.

The signal processing part 130 can receive the reflected signal from the receiving part 120 and directly sample it. The signal processing part 130 can distinguish a target object by comparing the directly sampled signal and/or a restored signal thereof with a reference signal obtained from a reflected signal from objects to distinguish the target object.

Figure 2:
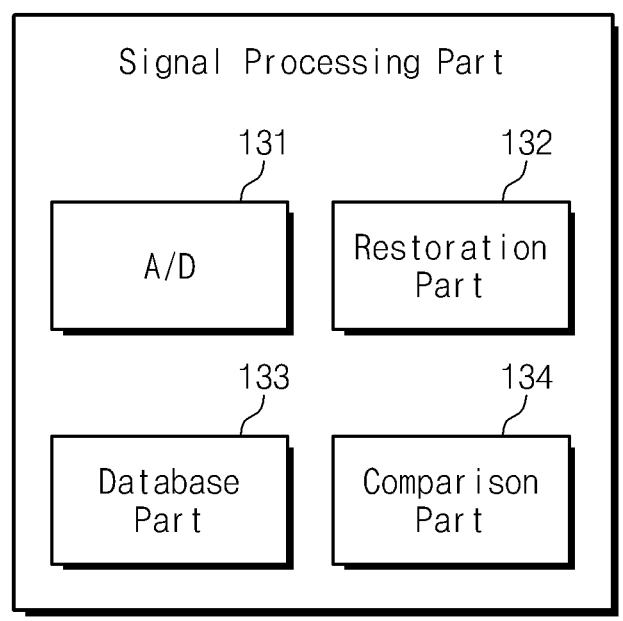
FIG. 2 is a block diagram illustrating a distinguishing aprt of radar in accordance with some embodiments of the inventive concept.

FIG. 2 is a block diagram illustrating a signal processing part of radar in accordance with some embodiments of the inventive concept.

Referring to FIG. 2, the signal processing part 130 may include an analog-to-digital (AD) conversion part 131 directly sampling the reflected signal received from the receiving part 120. The signal processing part 130, for detecting an object, may further include a restoration part 132 restoring the directly sampled signal of the reflected signal, a database part 133 storing a reference data obtained from a reflected signal from objects and a comparison part 134 distinguishing a target object by comparing the directly sampled signal of the reflected signal (i.e. a signal from the ADC conversion part 131) and/or a restored signal of the reflected signal (i.e., a signal from the restoring part 132) with the reference data (i.e., a reference data from the database part 133).

The analog-to-digital conversion part 131 will be described. The analog-to-digital conversion part 131 can sample a reflected signal being input with first intervals. The reflected signal being input may be an IR-UWB impulse signal. The first interval may be set so that a reflected signal is sampled while satisfying a Nyquist rate. The Nyquist rate means sampling the signal being input at a frequency higher than two times the maximum frequency of the signal being input so that loss of information does not occur during a sampling process. In the embodiment, the first interval may be for example 50 ps. In this case, the maximum frequency of reflected signal becomes 1 GHz and the first interval becomes 1/50 ps=20 GHz, so the Nyquist rate is satisfied. For example, the analog-to-digital conversion part 131 may sample the signal part of the reflected signal train, not sampling non-signal part of the reflected signal train (i.e., the non-signal part between the adjacent reflected signals).

The analog-to-digital conversion part 131 can change the first interval to a second interval. For example, the second interval may be greater than the first interval (e.g., 50 ps) and may be 20 ns. The analog-to-digital conversion part 131 can sample a reflected signal being input with the first intervals and can change an interval of sampled signals to the second interval during not-signal period (i.e. before a next reflected signal is input). When considering a characteristic of the IR-UWB system, the non-signal period (i.e., the period between two IR-UWB impulse signals) may be 2 μs. That is, during non-signal period (i.e., after direct sampling and before receiving next signal), the analog-to-digital conversion part 131 can change an interval of sampled signals to the second interval different from the first interval. For example, the second interval may be greater than the first interval.

The analog-to-digital conversion part 131 can quantize the sampled values with the second interval. The analog-to-digital conversion part 131 can perform quantization using a general quantization method.

Through the process described above, the analog-to-digital conversion part 131 may rapidly sample a reflected signal being input and slowly quantize the sampled signals of reflected signal during non-signal period (i.e., before a next reflected signal is input), and thereby the analog-to-digital conversion part 131 can directly sample a reflected signal being input. By directly sampling a reflected signal being input, the degree of accuracy of distinguishing a target object can be improved.

Figure 3:
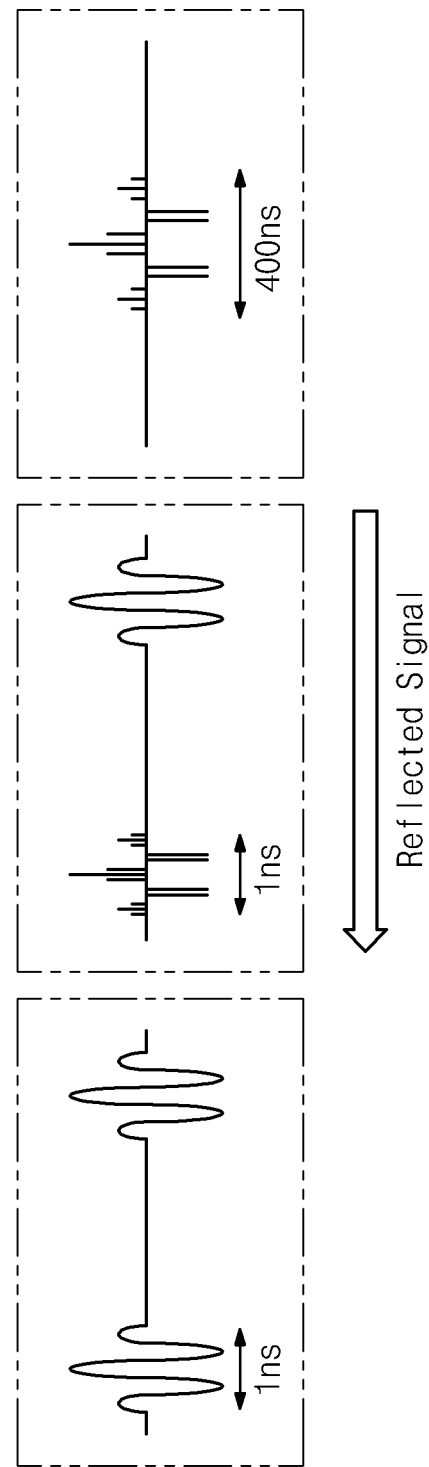
FIG. 3 is a drawing illustrating a reflected signal process of analog-digital conversion part of radar in accordance with some embodiments of the inventive concept.

FIG. 3 is a drawing illustrating a signal process in accordance with some embodiments of the inventive concept.

Referring to FIG. 3, it can be assumed that an IR-UWB impulse signal in accordance with some embodiments of the inventive concept has a pulse width of 1 ns. When considering a characteristic of IR-UWB system, an impulse signal is output from the transmission part 110 to a target object at predetermined intervals. The predetermined interval (e.g., non-signal period) may be 2 μs. This means that a reflected signal from a target object is received to the receiving part 120 at predetermined intervals. An arrow illustrated in FIG. 3 means a direction in which a reflected signal moves.

An IR-UWB impulse signal output by the transmission part 110 is reflected from a target object to be received to the receiving part 120. The analog-to-digital conversion part 131 can sample the received reflected signal with 50 ps interval and can expand an interval of the sampled values from 50 ps to 20 ns before a next reflected signal is received (during non-signal period 2 μs). Through the process described above, the analog-to-digital conversion part 131 can directly sample the reflected signal being received.

Referring back to FIG. 2, the restoration part 132 receives a reflected signal that is converted into a digital signal from the analog-to-digital conversion part 131 to restore the reflected signal to an analog signal. The restoration part 132 may include a digital-to-analog (D/A) conversion part and may perform a restoration to an analog signal through the digital-to-analog (D/A) conversion part. Since the restoration part 132 receives the directly sampled reflected signal through the analog-to-digital conversion part 131 and restores it to an analog signal, the reflected signal can be restored at a high degree of accuracy.

The database part 133 can store a reference data (reflected signal data from various objects), e.g., reflected signal patterns corresponding to objects. The database part 133 can be embodied by a flash memory device having mass storage capacity. The database part 133 can also be embodied by PRAM, MRAM, ReRAM, FRAM, etc. besides the flash memory.

The reflected signal data may include a pulse width and a peak value of reflected signal by the various objects. The reflected signal data may include a quantization value of reflected signal by various objects.

The comparison part 134 can distinguish a target object by comparing a restored signal by the restoration part 132 with reflected signal data stored in the database part 133. More specifically, the comparison part 134 can distinguish a target object by comparing at least one of pulse width and peak value of restored signal by the restoration part 132 with the stored reflected signal data in the database part 133.

The comparison part 134 can also distinguish a target object by comparing a quantization value of reflected signal quantized by the analog-to-digital conversion part 131 with a quantization value stored in the database part 133.

In the exemplary embodiment in connection with FIGS. 1 and 2, the restoration part, database part and comparing part are included in the signal processing part. However, at least one of the restoration part, database part and comparing part are included in the signal processing part may be outside the signal processing part, and the analog to digital convertor may be included in the signal processing part.

Figure 4:
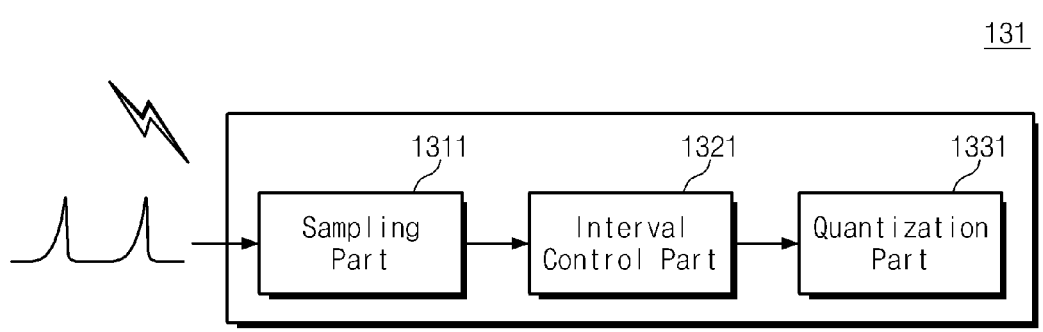
FIG. 4 is a block diagram illustrating a structure of analog-digital conversion part of radar in accordance with some embodiments of the inventive concept.

FIG. 4 is a block diagram illustrating an analog-digital conversion part of radar in accordance with some embodiments of the inventive concept.

Referring to FIG. 4, the analog-to-digital conversion part 131 may include a sampling part 1311, an interval control part 1321 and a quantization part 1331.

The sampling part 1311 can sample an IR-UWB impulse signal being input with a first interval. The first interval may be 50 ps as an illustration and may be determined within the scope satisfying a Nyquist rate. The sampling part 1311 can further include a storage part (not shown) storing sampled values which will be described with referenced to FIG. 5.

The interval control part 1321 can change an interval of values sampled at the first intervals to a second interval. The second interval may be greater than the first interval. The interval control part 1321 can operate during non-signal period (i.e., before a next IR-UWB impulse signal is input after an IR-UWB impulse signal being input is sampled by the sampling part 1311).

The quantization part 1331 can quantize the sampled values of which interval is changed to the second interval.

Figure 5:
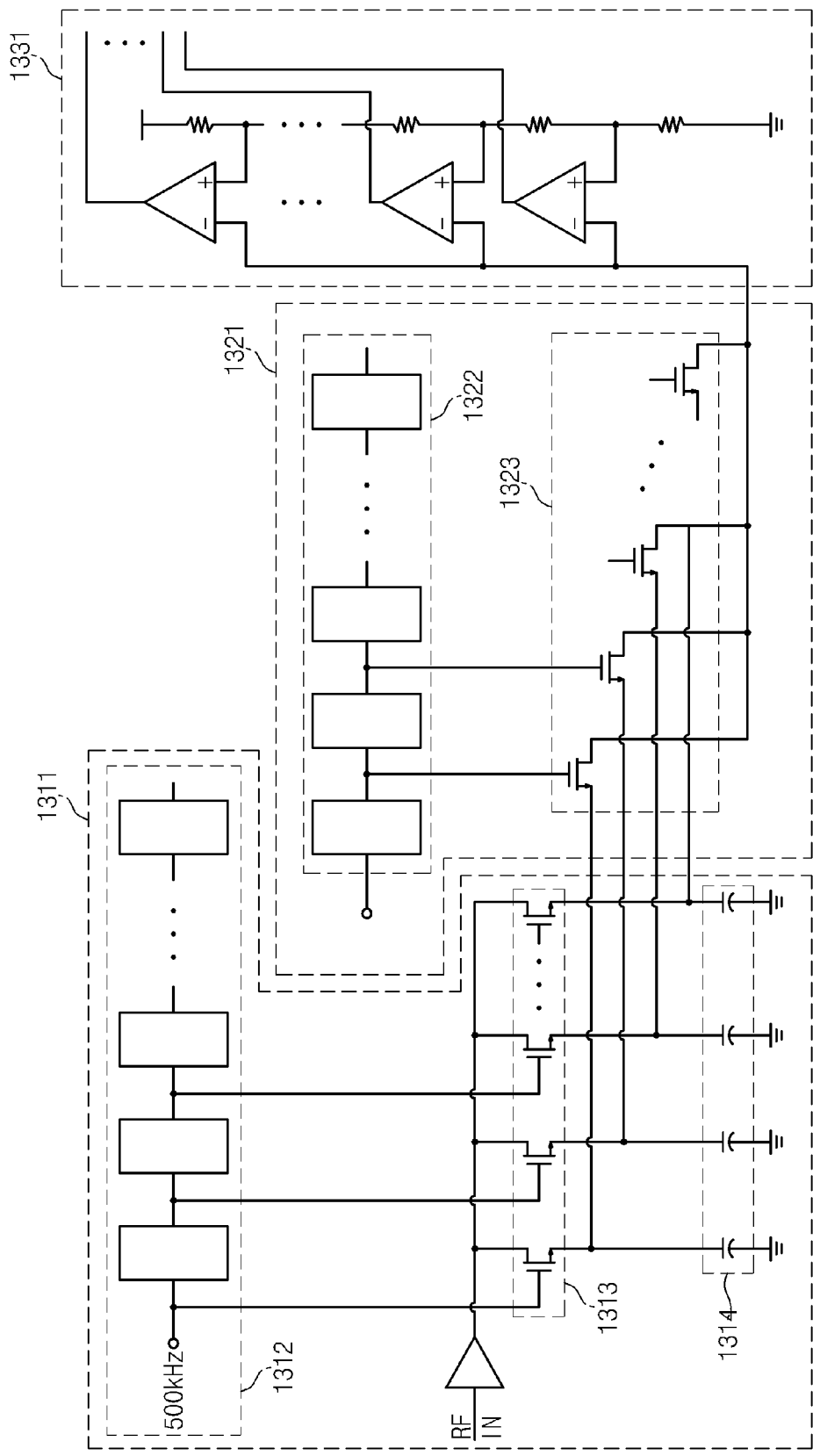
FIG. 5 is a circuit diagram of analog-digital conversion part of radar in accordance with some embodiments of the inventive concept.

FIG. 5 is a circuit diagram of analog-digital conversion part of radar in accordance with some embodiments of the inventive concept.

Referring to FIG. 5, the sampling part 1311 may include a plurality of sampling switches 1313 receiving an IR-UWB impulse signal through their input terminals and a plurality of fine delay cells 1312 sequentially delaying a reference signal at first intervals to output the delayed reference signal to control terminals of the plurality of sampling switches 1313. Each of the sampling switches 1313 may be an NMOS transistor or a PMOS transistor.

The interval control part 1321 may include a plurality of extension switches 1323 of which input terminals are connected to output terminals of the sampling switches 1313 and a plurality of coarse delay cells 1322 sequentially delaying a reference signal at second intervals to output the delayed reference signal to control terminals of the plurality of extension switches 1323. Each of the extension switches 1323 may be an NMOS transistor or a PMOS transistor.

The sampling part 1311 may further include a storage part 1314 storing an output value of the sampling part 1311. The storage part 1314 may be implemented with for example capacitors. The storage part 1314 may be the plural number and may be connected to each of the sampling switches 1313.

The quantization part 1331 may be implemented with for example a plurality of comparators and series resistances. The comparator may be an OP-AMP.

An IR-UWB impulse signal passes through a low noise amplifier to enter in each of the sampling switches 1313. The fine delay cells 1312 receive a reference signal to sequentially delay the reference signal, and then output the delayed reference signal to control terminals of the sampling switches 1313. The reference signal may be a signal of 500 KHz. Each of the fine delay cells 1312 may include 2n number of inverters (n is natural number) and can delay a reference signal for a predetermined time to output the delayed reference signal controlling a time delay of output signal of the inverter. The fine delay cell can delay a reference signal for 50 ps to output the delayed reference signal.

The number of the fine delay cells may be equal to the number of the sampling switches. For example, if the fine delay cell delays a reference signal for 50 ps in a process of analog to digital converting an IR-UWB impulse signal having a pulse width of 1 ns, twenty sampling switches may be needed to sample the IR-UWB impulse signal having a pulse width of 1 ns at 50 ps intervals. Thus, twenty the fine delay cells may be used.

As a signal is sequentially input to a control terminal of each of the sampling switches 1313, the sampling switches 1313 are sequentially turned on. As the sampling switches 1313 are turned on, currents flow through the storage part 1314 connected to output terminals of the sampling switches 1313. The storage part 1314 forms a predetermined voltage value. The storage part 1314 can maintain the predetermined voltage value until a signal enters in a control terminal of each of the extension switches 1323.

If all the sampling switches 1313 are turned on and thereby a predetermined voltage value is formed in the storage part 1314, a reference signal can be input into the coarse delay cells 1322. The coarse delay cells 1322 receive the reference signal to sequentially delay the reference signal, and then can output the delayed reference signal to a control terminal of each of the extension switches 1323. The reference signal may be a signal of 500 KHz. The coarse delay cell may include 2n number of inverters (n is natural number) and can delay the reference signal for a predetermined time to output the delayed reference signal controlling a time delay of output signal of the convertor. As an illustration, the coarse delay cell can delay the reference signal for 20 ns to output the delayed reference signal.

As a signal is sequentially input in a control terminal of each of the extension switches 1323, the extension switches 1323 are sequentially turned on. As the extension switches 1323 are turned on, a voltage is formed at the output terminal of each of the extension switches 1323. The voltage is input in an inverting terminal of the comparator connected to the output terminal.

The quantization part 1331 generates a voltage corresponding to a quantization level at a non-inverting terminal of the comparator using the reference signal and a series resistance network and compares the voltage at the non-inverting terminal with an input voltage at an inverting terminal to output a quantization value. Also, a voltage corresponding to a quantization level is generated at an inverting terminal of the comparator and an input voltage is applied to a non-inverting terminal of the comparator to compare the two voltages.

The IR-UWB impulse signal being input is sampled at 50 ps intervals by the plurality of sampling switches 1313 of which control terminals sequentially receive a signal from the plurality of fine delay cells 1312 at 50 ps intervals and sampled values are stored in the storage part (e.g., capacitor). After that, as the plurality of extension switches 1323 of which control terminals sequentially receive a signal from the plurality of coarse delay cells 1322 at 20 ns intervals is sequentially turned on, an interval of the sampled values extends at 20 ns intervals and the sampled values having an extended interval are transmitted to the quantization part 1331.

Figure 6:
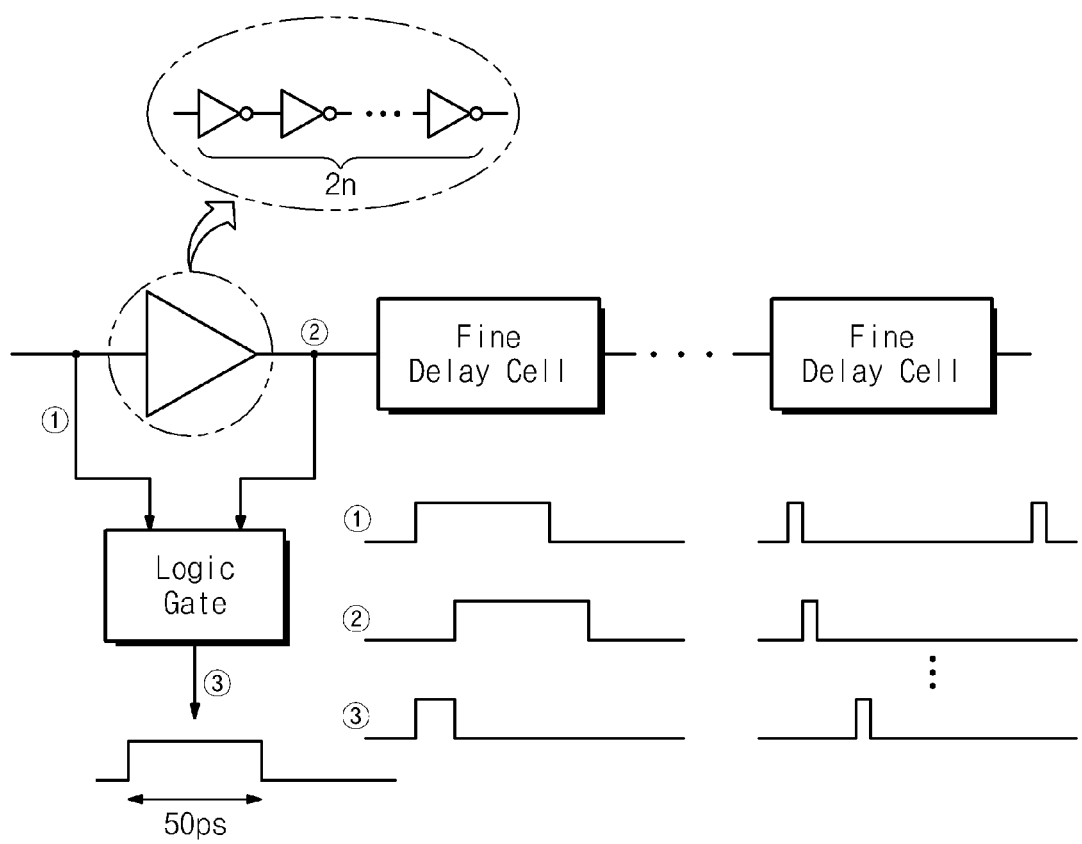
FIG. 6 is a drawing illustrating a structure of fine delay cell of analog-digital conversion part of radar in accordance with some embodiments of the inventive concept.
Figure 7:
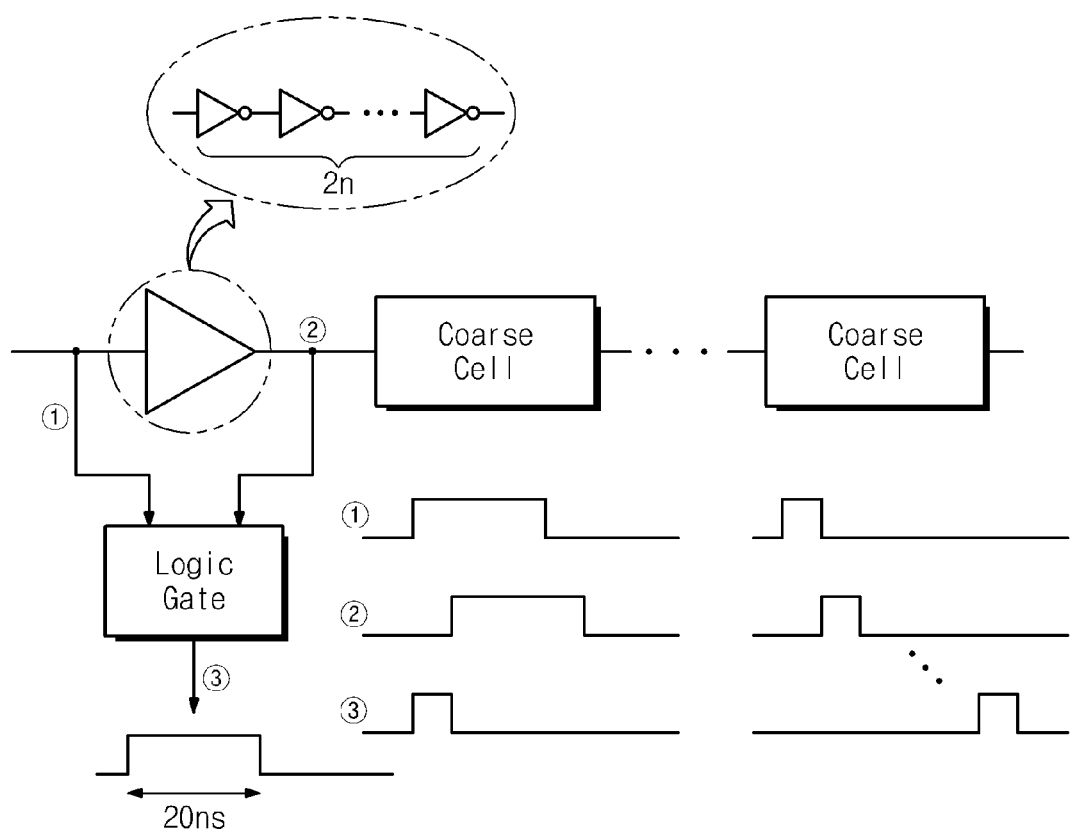
FIG. 7 is a drawing illustrating a structure of coarse delay cell of analog-digital conversion part of radar in accordance with some embodiments of the inventive concept.

FIG. 6 is a drawing illustrating a fine delay cell of analog-digital conversion part of radar in accordance with some embodiments of the inventive concept. FIG. 7 is a drawing illustrating a coarse delay cell of analog-digital conversion part of radar in accordance with some embodiments of the inventive concept.

Referring to FIGS. 6 and 7, the fine delay cell and the coarse delay cell in accordance with some embodiments of the inventive concept may include 2n number of inverters (n is natural number). The inverter can delay a signal being input for a predetermined time and can invert the signal to output it. Since the 2n number of inverters is connected to one another to operate, the inverters can function as a buffer.

The fine delay cell and the coarse delay cell can include logic gates respectively. The logic gate may be embodied by an XOR gate. The XOR gate receives an input signal and an output signal of buffer constituted by 2n number of inverters (n is natural number) to output a signal having a predetermined pulse width.

Figure 8:
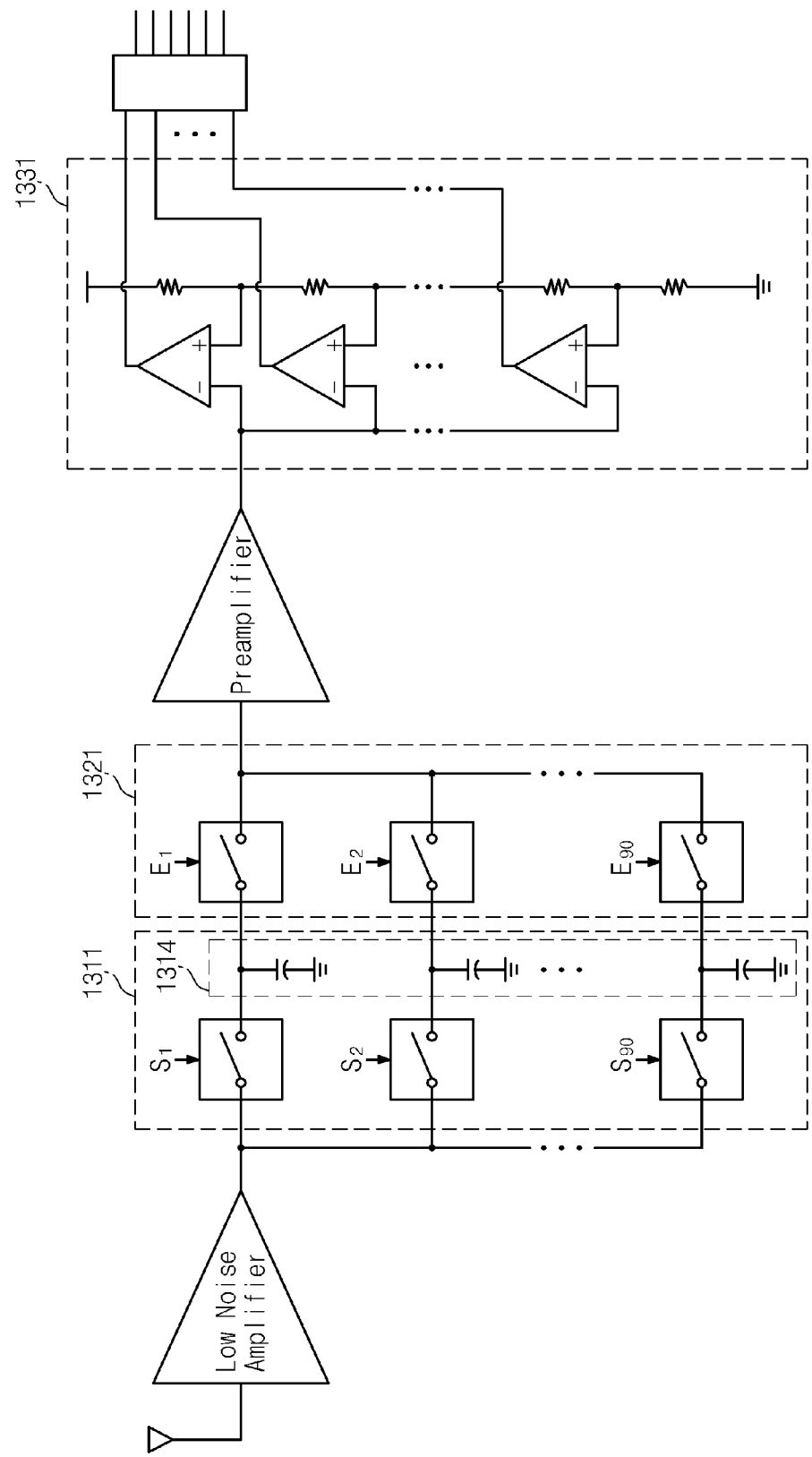
FIG. 8 is an equivalent circuit of analog-digital conversion part of radar in accordance with some embodiments of the inventive concept.

FIG. 8 is an equivalent circuit of analog-digital conversion part of radar in accordance with some embodiments of the inventive concept.

Referring to FIG. 8, the sampling part 1311 may include the storage part 1314. The sampling part 1311 may operate as switches S1~S90 which are on/off (shorted) at predetermined intervals. The predetermined interval may be 50 ps as an illustration. Since the switch is shorted at 50 ps intervals, an IR-UWB impulse signal being input is sampled at 50 ps intervals to be stored in the storage part 1314.

The interval control part 1321 may operate as switches E1~E90 which are on/off (shorted) at predetermined intervals. The predetermined interval of the interval control part 1321 may be 20 ns as an illustration. Since the switches E1~E90 are shorted at 20 ns intervals, an interval of the sampled values stored in the storage part 1314 extends from 50 ps to 20 ns to be transmitted to the quantized part 1331.

Figure 9:
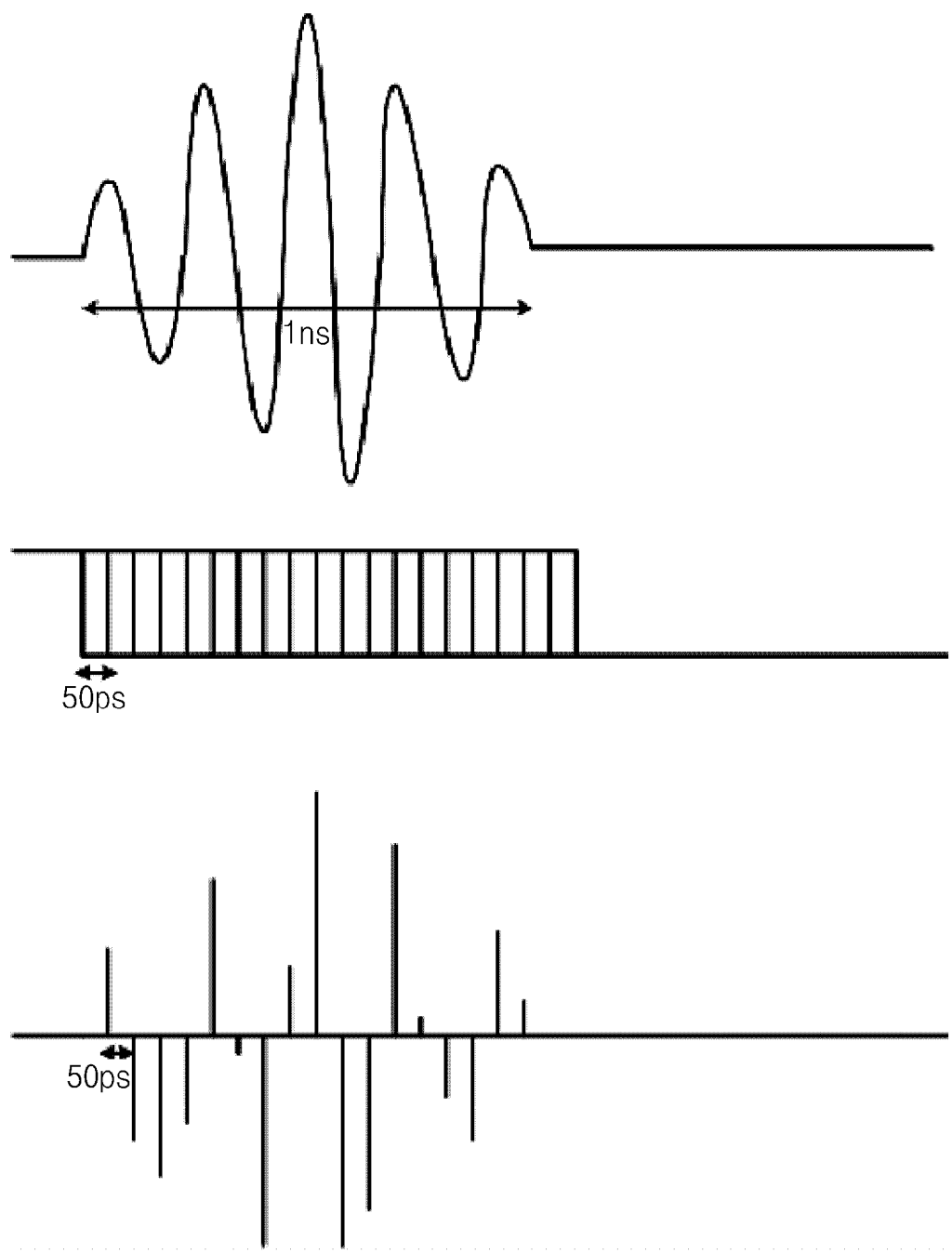
FIG. 9 is a drawing illustrating a signal process of sampling part of analog-digital conversion part of radar in accordance with some embodiments of the inventive concept.

FIG. 9 is a drawing illustrating a signal process of sampling part of analog-digital conversion part of radar in accordance with some embodiments of the inventive concept. Referring to FIG. 9, an IR-UWB impulse signal having a pulse width of 1 ns can be sampled at 50 ps intervals.

Figure 10:
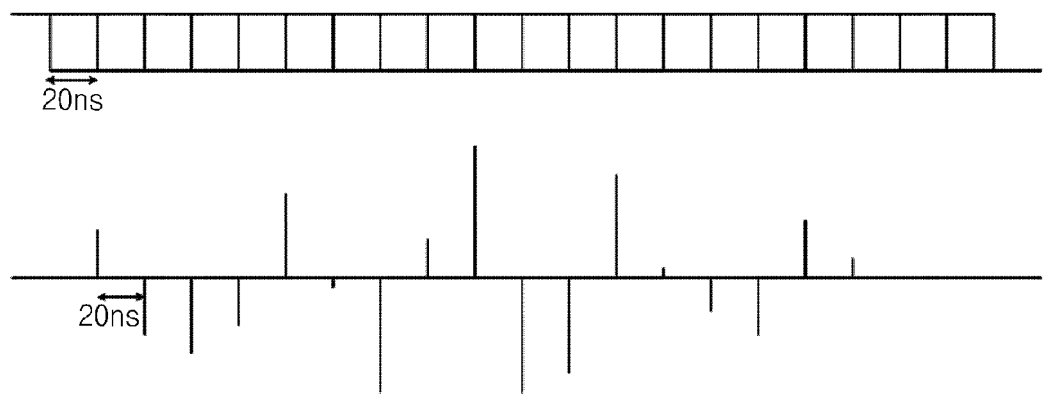
FIG. 10 is drawing illustrating a signal process of interval adjusting part of analog-digital conversion part of radar in accordance with some embodiments of the inventive concept.

FIG. 10 is drawing illustrating a signal process of interval adjusting part of analog-digital conversion part of radar in accordance with some embodiments of the inventive concept. Referring to FIG. 10, an interval of the sampled values sampled at 50 ps intervals extends to 20 ns.

Figure 11:
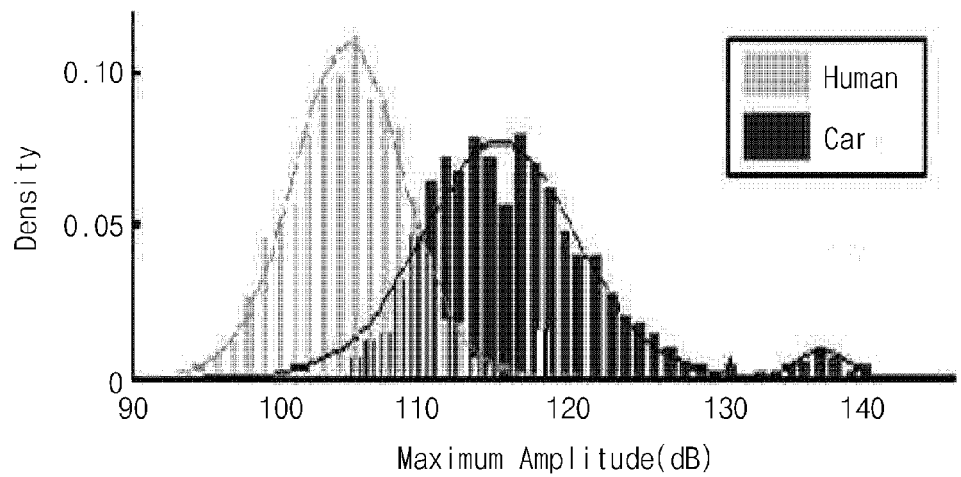
FIG. 11 is a graph showing the density relative to the maximum amplitude of the reflected signal from the human body and vehicle.

FIG. 11 is a graph showing the density relative to the maximum amplitude of the reflected signal from the human body and vehicle. FIG. 11 represents statistically a peak value (the maximum amplitude) of signal reflected from a target object such as a human body and a vehicle through repeated measurements.

When transmitting an IR-UWB impulse signal having the maximum amplitude of 140 dB to a body and a vehicle, in case of body, density becomes greatest in a section in which the maximum amplitude is about 105 dB and in case of vehicle, density becomes greatest in a section in which the maximum amplitude is about 116 dB. The maximum amplitude of reflected signal from human body is different from that of the vehicle. The amplitude of reflected signal can be varied depend on the objects. Such density relative to the maximum amplitude to various objects may be stored in the database part 133 as a reference data (reflected signal data). Thus, comparing the restored signal obtained by the signal processing (direct sampling and restoring) with the stored reflected signal data (e.g., density relative to the maximum amplitude), the target object can be distinguished.

Figure 12:
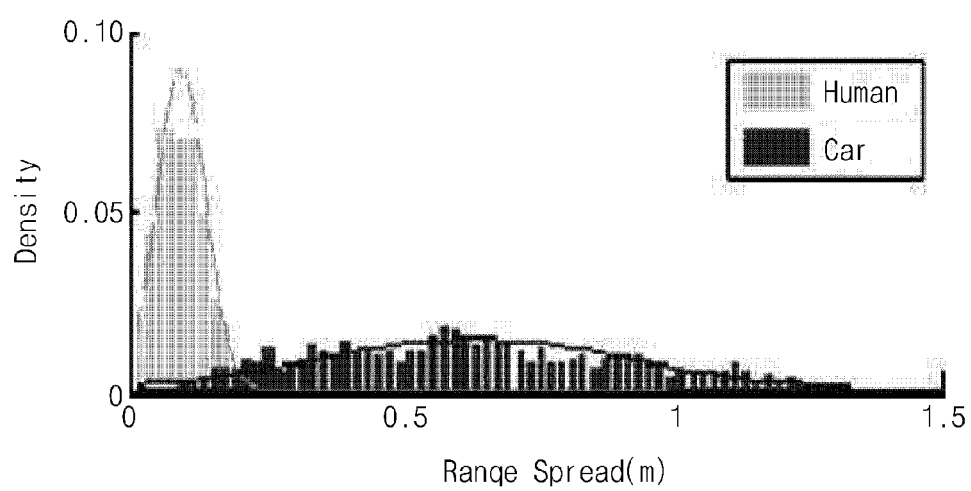
FIG. 12 is a graph showing the density relative to the maximum width of the reflected signal from the human body and vehicle.

FIG. 12 is a graph showing the density relative to the maximum pulse width of the reflected signal from the human body and vehicle. Referring to FIG. 12, a reflected signal from a body has a smaller range of maximum pulse width than a reflected signal from a vehicle. In case of vehicle, a very large range of maximum pulse width exists and this may be because of an effect by a multipath. Density relative to the pulse width of various of objects may be stored in the database part 133. Thus, comparing the restored signal obtained by the signal processing (direct sampling and restoring) with the stored reflected signal data (e.g., density relative to the pulse width), the target object can be distinguished.

Figure 13:
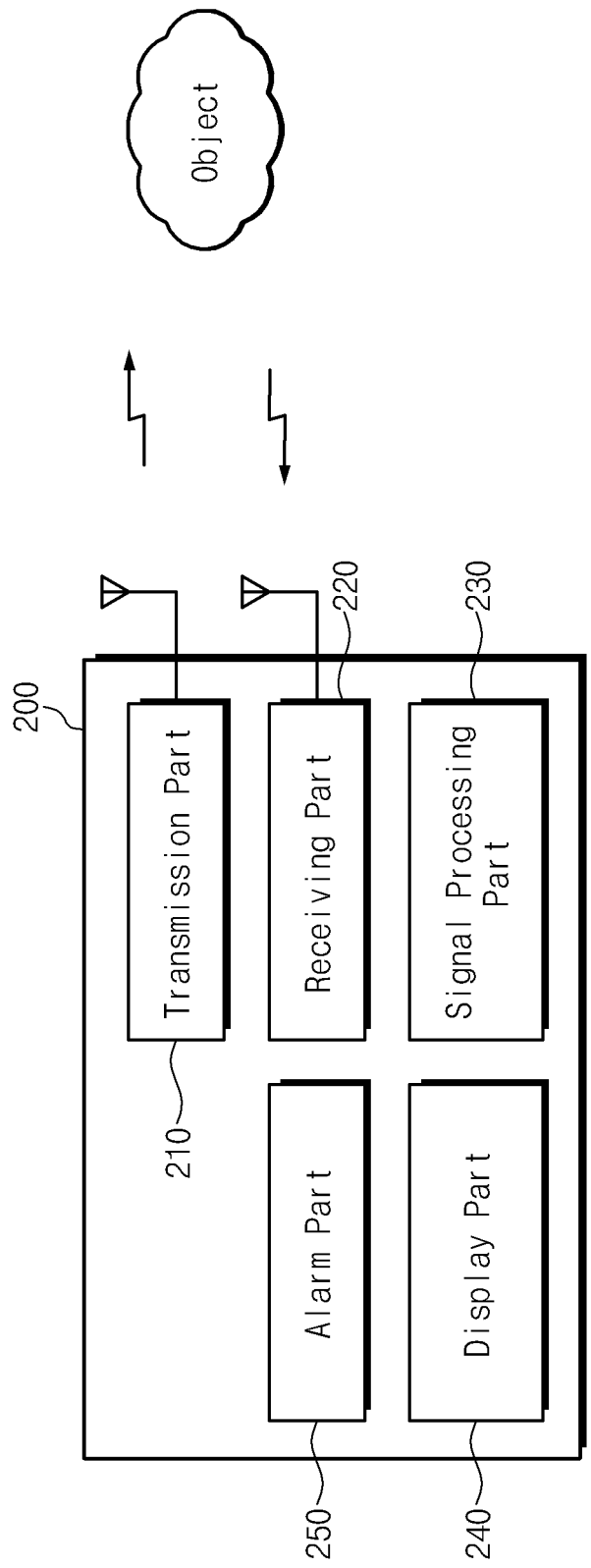
FIG. 13 is a block diagram illustrating a structure of radar in accordance with some other embodiments of the inventive concept.

FIG. 13 is a block diagram illustrating a radar in accordance with some other embodiments of the inventive concept.

Referring to FIG. 13, the radar 200 may include a transmission part 210, a receiving part 220, a signal processing part 230, a display part 240 and an alarm part 250.

The transmission part 210 may include a transmission antenna for outputting an IR-UWB impulse signal to a target object. The IR-UWB impulse signal may be an impulse signal having a pulse width of 1 ns. The receiving part 220 may include a receiving antenna for receiving a reflected signal from a target object.

An antenna having a narrow beam width can be used as the transmission antenna and/or the receiving antenna. As an illustration, an antenna having a beam width of pencil beam (2~3°) or needle beam (0.1~1°) can be used as the transmission antenna and/or the receiving antenna. Also, the transmission antenna and/or the receiving antenna can use various types of antennas that can be used in an ultra wideband communication system. As an illustration, the transmission antenna and/or the receiving antenna can use a chip antenna, a monopole antenna, a fat dipole antenna or a bow-tie antenna.

Although not illustrated in the drawing, the transmission part 210 may further include an impulse signal generating means. The impulse signal generating means can be implemented by using a frequency synthesizer, a bipolar transistor or a schottky diode.

Although not illustrated in the drawing, the receiving part 220 may further include a low noise amplifier for amplifying a reflected signal being received. The low noise amplifier is designed so as to amplify a reflected signal being received and to minimize a noise.

The signal processing part 230 can receive the reflected signal from the receiving part 220 and directly sample it. The signal processing part 230 can distinguish a target object by comparing a restored signal with stored reflected signal data.

The display part 240 can receive distinguishment result data from the signal processing part 230 to output it. The display part 240 includes a display panel visually outputting the distinguishment result data. The display panel may include a display device such as a liquid crystal display (LCD), a plasma display panel (PDP), an organic light emitting diode (OLED) and a cathode-ray tube. The distinguishement result data may include the type of distinguished target object and/or an index of coincidence between a restored signal and stored reflected signal data. The display part 240 may be disposed outside the radar 200. In this case, the distinguishment result data can be transmitted to the display part 240 through a wire or wireless communication.

The alarm part 250 receives the distinguishment result data from the signal processing part 230 and can generate an alarm signal depending on the distinguishment result data. The alarm signal may be a hearing signal such as a siren. Although not illustrated in the drawing, the alarm part 250 may include a control part. The control part can control the alarm part 250 so that an alarm signal is generated only when a distinguishment result is a specific object. The alarm part 250 may be controlled to generate an alarm signal when a distinguishment result is human and not to generate an alarm signal when a distinguishment result is a cat, a mouse, etc. To prevent a malfunction of the alarm part 250, the degree of accuracy of the distinguishment result through the signal processing part 230 is important. Since radar in accordance with the embodiment directly samples a reflected signal from a target object to process the sampled reflected signal, the reflected signal can be sampled without other additional signal processing. Thus, when restoring the reflected signal, the degree of accuracy can be improved. Further, when distinguishing a target object, the degree of accuracy can also be improved.

Figure 14:
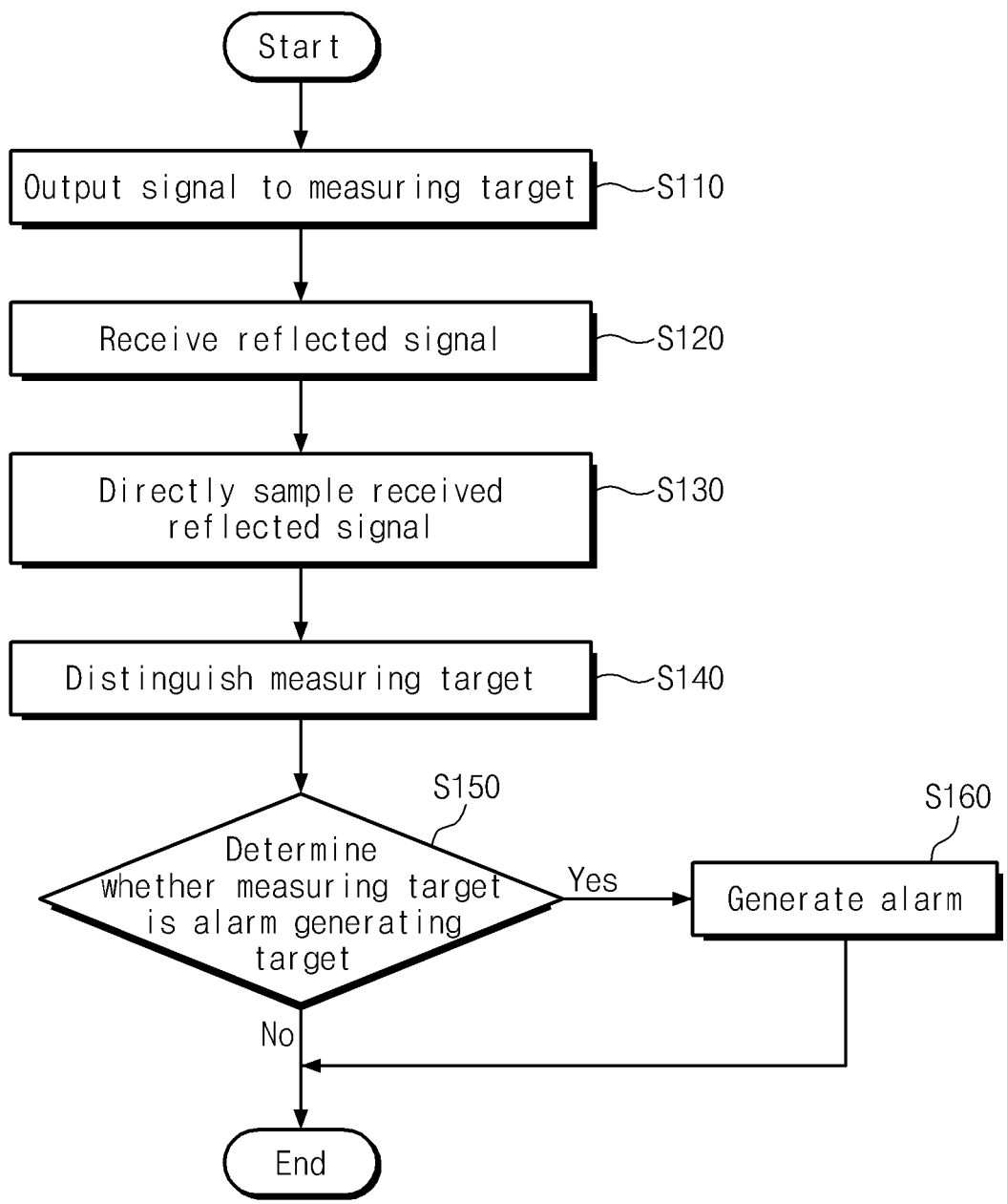
FIG. 14 is a flow chart illustrating an object recognition method using radar in accordance with some embodiments of the inventive concept.

FIG. 14 is a flow chart illustrating an object recognition method using radar in accordance with some embodiments of the inventive concept.

As illustrated in FIG. 14, an object recognition method using radar in accordance with some embodiments of the inventive concept may include a step S110 of outputting a signal to a target object, a step S120 of receiving a reflected signal from the target object, a step S130 of directly sampling the received reflected signal, a step S140 of distinguishing the target object, a step S150 of determining whether the target object is an alarm generating target on the basis of measuring result data and a step S160 of generating an alarm.

The step S110 of generating a signal to a target object may be a process of outputting an IR-UWB impulse signal to the target object through a transmission antenna. The IR-UWB impulse signal may be an impulse signal having a pulse width of 1 ns. The IR-UWB impulse signal is illustrated as the signal which is output to the target object but the inventive concept is not limited thereto. All sorts of signals having a fixed size and a repetitive waveform can be applied to the signal which is output to the target object.

The step S120 of receiving a reflected signal from the target object may be a process of receiving an IR-UWB impulse signal reflected from a target object through a receiving antenna.

The S130 of directly sampling the received reflected signal may be a process of sampling the received signal at first intervals, changing values sampled at first intervals to a second interval different from the first interval in a section of before a next reflected signal is received, and then quantizing sampled values changed to the second interval. The first interval can be set so that an IR-UWB impulse signal is sampled while satisfying a Nyquist rate. The first interval may be 50 ps as an illustration. The second interval may be greater than the first interval. The second interval may be 20 ns as an illustration.

The step S140 of distinguishing the target object may be a process of comparing a signal that the directly sampled reflected signal is restored with stored reflected signal data to distinguish a target object. The step of 140 may be a process of comparing at least one of a pulse width and a peak value of reflected signal restored to an analog signal by the restoration part with reflected signal data stored in a database to distinguish the target object. The step of 140 may be a process of comparing a quantization value of extracted reflected signal with a quantization value of the reflected signal in accordance with the target object stored in a database.

The step S150 may be a process of determining whether the target object is an alarm generating target on the basis of measuring result data to control the alarm part 150. The step S160 may be a process of generating an alarm signal when it is determined that the target object is an alarm signal generating target.

As described above, since the radar in accordance with some embodiments of the inventive concept directly samples a reflected signal from a target object to process the sampled reflected signal, the degree of precision can be improved when restoring a reflected signal from the target object. Also, a high speed signal process is possible. Further, the degree of distinguishment accuracy of the target object can be improved. SNR of radar can be improved. An unnecessary alarm signal generation can be reduced by accurately distinguishing the target object to control an operation of the alarm part.

The radar in accordance with some embodiments of the inventive concept can be applied to various fields such as a security radar field using object recognition, a vehicle radar field using a distance measuring technology, a human body radar field measuring a physiological signal of body, etc.

The foregoing is illustrative of the inventive concept and is not to be construed as limiting thereof. Although a few embodiments of the inventive concept have been described, those skilled in the art will readily appreciate that many modifications are possible in the embodiments without materially departing from the novel teachings and advantages of the present invention. Accordingly, all such modifications are intended to be included within the scope of the present invention as defined in the claims. The present invention is defined by the following claims, with equivalents of the claims to be included therein.

What is claimed is:

1. A radar comprising:
a receiving part receiving a signal reflected from a target object; and
a signal processing part processing the reflected signal,
wherein the signal processing part directly samples the reflected signal,
wherein the signal processing part comprises an analog-to-digital converter directly sampling the reflected signal, and
wherein the analog-to-digital converter samples the reflected signal at a first interval to generate first sampled signals having the first interval, modifies the first sampled signals to obtain second sampled signals having a second interval different from the first interval before a next reflected signal is input to the analog-to-digital converter, and quantizes the second sampled signals.

2. The radar of claim 1, wherein the signal processing part further comprises:
a restoration part restoring a restored signal from the first sampled signals; and
a comparing part comparing at least one of the first sampled signals and the restored signal with a reference data.

3. The radar of claim 2, further comprising a database part storing the reference data.

4. The radar of claim 1, further comprising a display part displaying distinguishment result data from the signal processing part.

5. The radar of claim 1, further comprising an alarm part receiving distinguishment result data from the signal processing part and generating an alarm signal.

6. The radar of claim 1, further comprising a transmission part emitting a signal to the target object,
wherein the transmission part comprises a transmission antenna for outputting a signal to the target object, and
wherein the receiving part comprises a receiving antenna for receiving the reflected signal from the target object.

7. The radar of claim 1, wherein the second interval is greater than the first interval and the analog-to-digital converter expands the first interval of the first sampled signals.

8. A signal processor comprising:
a sampling part directly sampling an IR-UWB impulse signal at a first interval to generate first sampled signals having the first interval; and
an interval control part modifying the first sampled signals to obtain second sampled signals having a second interval different from the first interval before a next impulse signal is input to the signal processor, and quantizing the second sampled signals.

9. The signal processor of claim 8, wherein the sampling part samples the IR-UWB impulse signal with at least a Nyquist rate.

10. The signal processor of claim 9, wherein the interval control part increases the first interval between the first sampled signals.

11. A method of processing an IR-UWB impulse signal comprising:
directly sampling the IR-UWB impulse signal with a first interval to generate first sampled signals having the first interval;
modifying the first sampled signals obtain second sampled signals having a second interval different from the first interval before a next impulse reflected signal is input; and
quantizing the second sampled signals.

12. The method of claim 11, wherein the second interval is greater than the first interval.

13. The method of claim 11, further comprising comparing the first sampled signals with reference signal data to distinguish a target object.

14. The method of claim 11, further comprising:
restoring a restored signal from the first sampled signals; and
comparing the restored signal with reference signal data to distinguish a target object.

15. A method of processing a signal, the method comprising:
receiving an impulse signal train;
sampling the impulse signal train with at least a Nyquist rate to generate first sampled signals having a first interval;
modifying the first sampled signals to obtain second sampled signals having a second interval to expand the first interval of the first sampled signals to the second interval during a non-signal period between two adjacent impulse signals in the impulse signal train; and
quantizing the second sampled signal.

* * * * *